(12) United States Patent
Olgaard et al.

(10) Patent No.: US 6,268,780 B1
(45) Date of Patent: Jul. 31, 2001

(54) FREQUENCY SYNTHESIZER WITH DIGITAL FREQUENCY LOCK LOOP

(75) Inventors: Christian Olgaard, Sunnyvale; Benny Madsen, Los Altos, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/558,927

(22) Filed: Apr. 26, 2000

(51) Int. Cl.[7] ............... H03L 7/08; H03L 7/10; H03L 7/16; H03C 3/00
(52) U.S. Cl. ............ 332/117; 332/127; 332/128; 327/156; 331/14; 331/16; 331/17; 331/23; 375/376; 455/260
(58) Field of Search ............... 332/100–102, 332/117, 127, 128; 327/156–159; 331/1 A, 8, 14, 16–18, 23, 25; 375/376; 455/260

(56) References Cited

U.S. PATENT DOCUMENTS

| | | | |
|---|---|---|---|
| 4,533,880 | 8/1985 | Geurts | 331/1 A |
| 5,027,087 * | 6/1991 | Rottinghaus | 332/127 |
| 5,053,723 | 10/1991 | Schemmel | 331/14 |
| 5,079,526 | 1/1992 | Heck | 332/127 |
| 5,182,528 | 1/1993 | Zuta | 331/1 A |
| 5,216,374 | 6/1993 | George et al. | 328/14 |
| 5,408,687 | 4/1995 | Ooga | 455/76 |
| 5,412,338 | 5/1995 | Richards et al. | 327/107 |
| 5,414,390 | 5/1995 | Kovacs et al. | 331/2 |
| 5,430,660 | 7/1995 | Lueker et al. | 364/486 |
| 5,430,764 | 7/1995 | Chren, Jr. | 375/308 |
| 5,440,259 | 8/1995 | Yokomura | 327/160 |
| 5,471,661 | 11/1995 | Atkinson | 455/165.1 |
| 5,477,194 | 12/1995 | Nagakura | 331/10 |
| 5,483,203 | 1/1996 | Rottinghaus | 331/10 |
| 5,487,093 | 1/1996 | Adresen et al. | 375/376 |
| 5,502,420 | 3/1996 | Barclay | 332/135 |
| 5,506,584 | 4/1996 | Boles | 342/42 |
| 5,521,556 | 5/1996 | O'Shaughnessy et al. | 331/1 R |
| 5,533,059 | 7/1996 | Tsuda | 375/327 |
| 5,546,433 | 8/1996 | Tran et al. | 375/376 |
| 5,552,748 | 9/1996 | O'Shaughnessy | 331/1 A |
| 5,568,512 | 10/1996 | Rotzoll | 375/221 |
| 5,619,535 | 4/1997 | Alvarez, Jr. | 375/308 |
| 5,642,385 | 6/1997 | Alberty | 375/354 |
| 5,644,601 | 7/1997 | Kawaguchi | 375/295 |
| 5,705,955 * | 1/1998 | Freeburg et al. | 331/14 |
| 6,081,163 * | 6/2000 | Ujiie et al. | 331/2 |

* cited by examiner

*Primary Examiner*—David Mis
(74) *Attorney, Agent, or Firm*—Baker & McKenzie

(57) ABSTRACT

A frequency synthesizer with a digital frequency lock loop (FLL) having a fast frequency lock time uses a frequency counter circuit in the feedback loop to count the output signal frequency and produce frequency count data. A modulation control circuit provides modulation data and a corresponding modulation control signal for modulating the FLL signal source. A microprocessor processes the frequency count data along with the modulation data to provide a frequency control signal for controlling the nominal, or center, frequency of the FLL signal source. By processing these data together, thereby accounting for the amount of modulation applied to the FLL signal source, the center frequency can be maintained more consistently notwithstanding the presence of modulation within the feedback loop signal.

37 Claims, 1 Drawing Sheet

FREQUENCY SYNTHESIZER WITH DIGITAL FREQUENCY LOCK LOOP

BACKGROUND OF THE INVENTION

1. Field of the Invention

The present invention relates to frequency synthesizers for digital communication systems, and in particular, to frequency synthesizers using digital frequency lock loops and allowing direct modulation of the oscillator signal source.

2. Description of the Related Art

Time division multiple access (TDMA) wireless communication systems use discreet time slots for transmitting data at various defined frequencies. These data transmission time slots are separated by guard time slots to prevent signal collisions and allow the various signal sources within the system to settle at the defined transmission frequencies. Examples of such systems include wireless local area network (LAN) systems and cordless telephone systems, such as that defined according to the DECT standard. By way of example, the DECT time slot is approximately 400 microseconds, with a guard time slot of approximately 20–30 microseconds. Therefore, to achieve zero blindslot operation with a single signal source, a lock time of 20 microseconds is required.

One technique which has been used to implement a frequency synthesizer with a fast lock time is to replace a traditional phase lock loop (PLL) within the frequency synthesizer by a frequency counter, a digital-to-analog converter (DAC) and a signal processor (e.g., a microprocessor). The oscillator output is counted by the frequency counter to produce frequency count data. This frequency count data is processed by the signal processor to produce frequency control data which is converted to the appropriate analog signal by the DAC which drives the oscillator. One could also use a digital band select stage within the signal source (e.g., voltage-controlled oscillator) along with a lower resolution tuning DAC. One example of such an implementation can be found in U.S. Pat. No. 5,182,528, the disclosure of which is incorporated herein by reference. As noted, the DAC drives the oscillator and the frequency counter verifies the resulting frequency by counting the number of oscillator signal cycles within a predefined time period. From this count, the frequency can be derived. Accordingly, the locking time is defined by the settling time of the DAC. Some form of data storage circuit is used to store the DAC input data needed for the oscillator (e.g., a voltage-controlled oscillator) to generate the desired frequencies used for the system.

With the frequency counter connected directly to the output of the oscillator to count the cycles of the output signal, the counter will be driven by a continuous, or CW, signal during the receive mode of operation, but will be driven by a modulated signal during the transmit mode of operation. As noted, the frequency counter counts the number of oscillator signal periods that occur within a predefined time period which is derived from a system timing unit such as a crystal-referenced oscillator circuit. If the frequency is not within the desired frequency limits, the data presented to the DAC will be modified accordingly (via the data storage circuit) to compensate for any frequency differences until the next time the frequency is to be used. In the receive mode, with the signal having a constant frequency, this frequency compensation is easily done. However, in the transmit mode, with the output signal being modulated in frequency, the derived frequency count information provided by the counter will not accurately reflect the nominal, or center, frequency required to be generated by the oscillator circuit.

Accordingly, it would be desirable to have a way to monitor and maintain frequency lock for a frequency modulated signal while still providing for a fast frequency lock time by using a counter circuit in the feedback loop and a DAC to drive the oscillator circuit directly.

SUMMARY OF THE INVENTION

Figure 1:
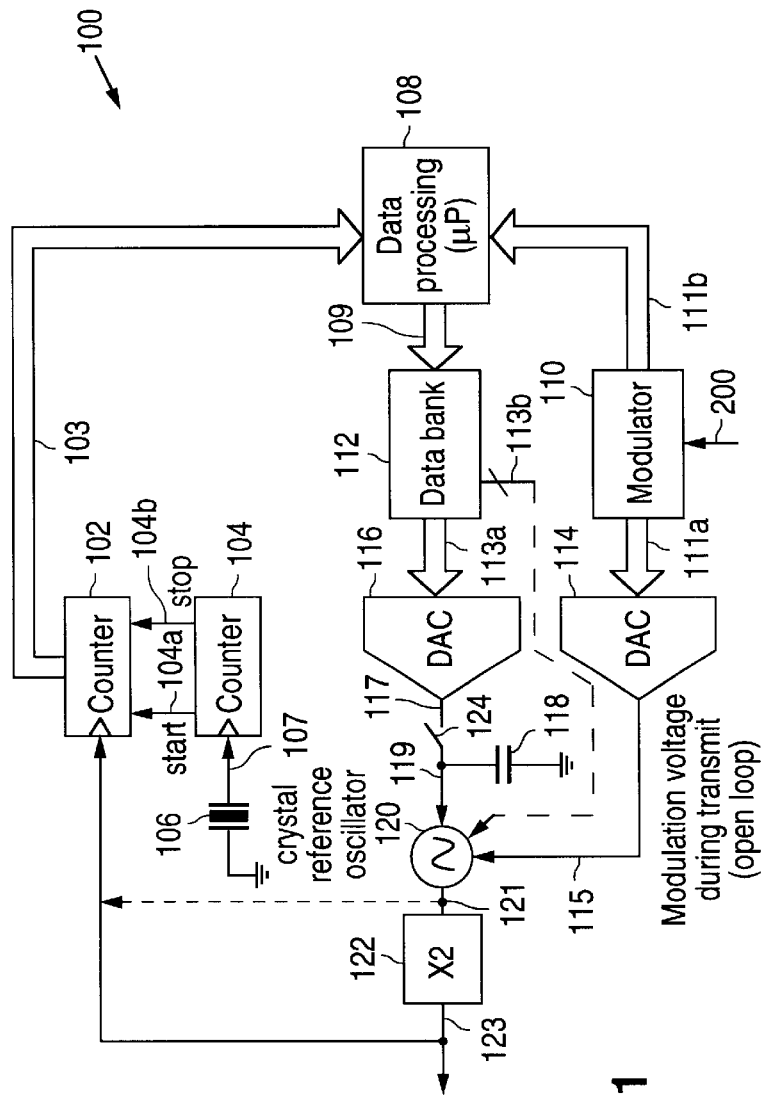
FIG. 1 is a functional block diagram of a frequency synthesizer with a digital FLL in accordance with one embodiment with the present invention.

A frequency synthesizer with a digital FLL in accordance with the present invention uses a frequency counter circuit in the feedback loop to count the output signal frequency and uses a DAC to provide the frequency control signal for the oscillator circuit. (Alternatively, a lower resolution DAC can be used to provide fine tuning control in combination with an oscillator having a band select section which provides coarse tuning control.) A modulation control circuit provides modulation data for generating a modulation control signal for the oscillator circuit. The modulation data from the modulation control circuit and the frequency count data from the feedback loop are processed together to determine the appropriate compensation data to be provided to the DAC which controls the center frequency of the oscillator signal. By processing these data together, thereby accounting for the amount of modulation applied to the FLL signal source, the center frequency can be maintained more accurately notwithstanding the presence of modulation within the feedback loop signal.

In accordance with one embodiment of the present invention, a frequency synthesizer with a digital frequency lock loop (FLL) includes a frequency measurement circuit, a modulation control circuit and a data processing and control circuit. The frequency measurement circuit is configured to couple to a controllable signal generator circuit, receive from the controllable signal generator circuit a controlled signal having a controlled signal frequency and measure the controlled signal frequency and in accordance therewith provide measured frequency data. The controlled signal frequency has associated therewith a center frequency value, an instantaneous frequency value and a frequency deviation value equal to a difference between the center and instantaneous frequency values, and the measured frequency data represent the instantaneous frequency value. The modulation control circuit is configured to couple to the controllable signal generator circuit, provide modulation data and provide to the controllable signal generator circuit a modulation control signal that controls the instantaneous signal frequency value, wherein the modulation data represent the frequency deviation value. The data processing and control circuit, coupled between the frequency measurement circuit and the modulation control circuit, is configured to couple to the controllable signal generator circuit and receive and process the measured frequency data and the modulation data and in accordance therewith provide to the controllable signal generator circuit at least one frequency control signal that controls the center signal frequency value.

In accordance with another embodiment of the present invention, a frequency synthesizer with a digital frequency lock loop (FLL) includes a frequency measurement circuit, a modulation control circuit and a data processing and control circuit. The frequency measurement circuit is configured to couple to a controllable signal generator circuit, receive from the controllable signal generator circuit a controlled signal having a controlled signal frequency and measure the controlled signal frequency and in accordance therewith provide measured frequency data. The controlled signal frequency has associated therewith a center frequency value, an instantaneous frequency value and a frequency deviation value equal to a difference between the center and instantaneous frequency values, and the measured frequency data represent the instantaneous frequency value. The modulation control circuit is configured to couple to the controllable signal generator circuit, provide modulation data and provide to the controllable signal generator circuit corresponding modulation control data that control the instantaneous signal frequency value, wherein the modulation data represent the frequency deviation value. The data processing and control circuit, coupled between the frequency measurement circuit and the modulation control circuit, is configured to couple to the controllable signal generator circuit and receive and process the measured frequency data and the modulation data and in accordance therewith provide to the controllable signal generator circuit frequency control data that control the center signal frequency value.

In accordance with still another embodiment of the present invention, a method of frequency synthesis includes the steps of:

receiving a controlled signal with a controlled signal frequency having associated therewith a center frequency value, an instantaneous frequency value and a frequency deviation value equal to a difference between the center and instantaneous frequency values;

measuring the controlled signal frequency and in accordance therewith generating measured frequency data representing the instantaneous frequency value;

generating modulation data representing the frequency deviation value;

generating a modulation control signal for controlling the instantaneous signal frequency value; and processing the measured frequency data and the modulation data and in accordance therewith generating at least one frequency control signal for controlling the center signal frequency value.

In accordance with yet another embodiment of the present invention, a method of frequency synthesis includes the steps of:

receiving a controlled signal with a controlled signal frequency having associated therewith a center frequency value, an instantaneous frequency value and a frequency deviation value equal to a difference between the center and instantaneous frequency values;

measuring the controlled signal frequency and in accordance therewith generating measured frequency data representing the instantaneous frequency value;

generating modulation data representing the frequency deviation value;

generating corresponding modulation control data for controlling the instantaneous signal frequency value; and processing the measured frequency data and the modulation data and in accordance therewith generating frequency control data for controlling the center signal frequency value.

These and other features and advantages of the present invention will be understood upon consideration of the following detailed description of the invention and the accompanying drawings.

DETAILED DESCRIPTION OF THE INVENTION

Referring to FIG. 1, a frequency synthesizer with a digital FLL 100 in accordance with one embodiment of the present invention includes frequency counters, 102, 104, a crystal reference oscillator circuit 106, a data processing circuit 108 (e.g., a microprocessor), a modulator circuit 110, a data bank circuit 112 (e.g., memory or other data storage circuitry), DAC circuits 114, 116, a sample-and-hold circuit in the form of a switch 124 and a shunt capacitor 118, a controllable signal generator circuit 120 (e.g., a voltage controlled oscillator (VCO)), and a frequency multiplier circuit 122 (e.g., a frequency doubler), interconnected substantially as shown.

The DACs 114, 116 are depicted as being single DAC circuits. However, it will be readily understood that one or both of these DAC circuits 114, 116 can be implemented in the form of a dual DAC circuit, thereby providing one DAC circuit for coarse frequency tuning and another DAC circuit for fine frequency tuning. Alternatively, e.g., in the case of the center frequency control DAC 116, the frequency control data 113a presented to the DAC 116 can be used to provide the fine frequency control, while additional frequency control data 113b can be presented to a storage element (e.g., register) within the VCO 120 for controlling a band select network (e.g., an array of switched capacitors for controlling the center frequency of a resonant network).

Also, while the feedback counter 102 used to count the periods of the output signal 123 is represented as a single counter circuit, it will be readily understood that this counter 102 can be implemented with a fixed or variable prescaler and a fixed or programmable counter in accordance with well-known FLL design techniques. (For example, if the prescaler is used, an appropriate count value can be added to the output data 103 provided by the counter 102 prior to processing within the data processor 108.) Lastly, the frequency multiplier circuit 122 is not necessary for purposes of the present invention. By using a frequency multiplier circuit 122, however, frequency pulling of the output of the oscillator 120 is prevented and the frequency accuracy required from the oscillator 120 may be reduced. Accordingly, the output 121 of the oscillator 120 may be used to drive the counter 102 directly.

As noted, the output signal 123 (or 121) is counted by the feedback counter 102 during a predetermined time interval defined by the occurrences of the assertions of the start 104a and stop 104b control signals from the time interval counter 104. Accuracy of this time interval is established by the reference signal 107 from the crystal reference oscillator circuit 106. (As will be readily appreciated, these start and stop signals 104a, 104b can be a single signal with each transition between the binary states defining the starting and stopping times for the count sequence in the feedback counter 102.) The resulting frequency count data 103 is presented to the data processor 108.

During the data transmission time slot, the modulator circuit 110, in accordance with a modulator control signal 200, provides modulation control data 111a to the modulator DAC 114 which converts this data into the appropriate analog modulation control signal 115 for the oscillator 120.

Modulation data 111b is provided to the data processor 108. This modulation data 111b informs the data processor 108 how much the output signal 121 of the oscillator 120 is going to be modulated in frequency. In other words, this modulation data 111b represents the amount of frequency deviation of the oscillator output signal 121.

It will be readily appreciated that the modulation control data 111a and modulation data 111b can be identical or different, depending upon the particular implementation. For example, the modulation control data 111a can be established to take into account any known non-linearities or other characteristics of the oscillator 120, while the modulation data 111b can be defined to represent the frequency deviation directly without accounting for any specific characteristics of the particular oscillator 120. Alternatively, these data 111a, 111b can be identical with the data processor 108 making any necessary adjustments to account for the characteristics of the oscillator 120. Further alternatively, these data 111a, 111b can be identical, with the modulation DAC 114 being designed to introduce any compensation necessary to account for the characteristics of the oscillator 120.

The frequency count data 103 from the feedback counter 102 and the modulation data 111b from the modulator 110 are processed together within the data processor 108 to produce measured frequency data 109. This measured frequency data 109 is used to select the appropriate frequency control data within the data bank 112. The selected frequency control data 113a is used to drive the frequency control DAC 116 which generates the appropriate analog frequency control signal 117 for the oscillator 120. This analog control signal 117 is sampled by being applied to the capacitor 118 via the switch 124 during the guard time slots. During the data transmission time slots, the switch 124 is open, thereby allowing the modulation control signal 115 to drive the oscillator 120 in an open loop configuration.

As should be readily appreciated, by processing the frequency count data 103 from the feedback counter 102 in conjunction with the modulation data 111b from the modulator 110, the data processor 108 can account for, e.g., subtract out, effects of the modulation applied to the oscillator 120. This allows the current data addressing data 109 to be generated for selecting the appropriate frequency control data within the data bank 112, thereby, in turn, providing the correct frequency control data 113a to the frequency control DAC 116.

Following initial application of power to the frequency synthesizer 100, the data processor 108 generates a sequence of data 109 to select a sequence of frequency control data 113a from the data bank 112. This causes the oscillator 120 to be sequenced through the various channel frequencies. Each of these channel frequencies is tested (without modulation) so that the data processor 108 can evaluate and, if necessary, modify the frequency control data stored within the data bank 112. For example, a conventional least means square (LMS) search algorithm can be used to cycle the oscillator 120 through the various channel frequencies and make any necessary adjustments to the frequency control data stored within the data bank 112.

Figure 2:
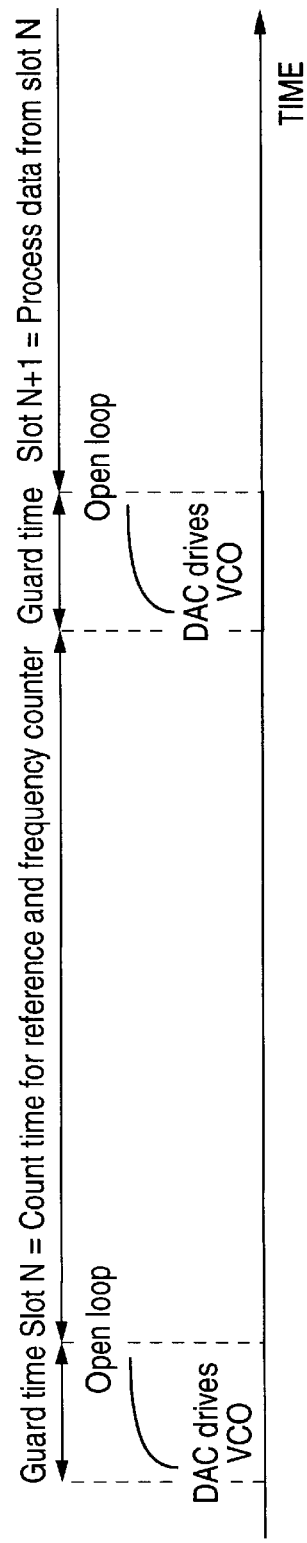
FIG. 2 is a timing diagram illustrating the data transmission and guard time slots for a typical TDMA system for which a frequency synthesizer in accordance with the present invention is particularly advantageous.

Referring to FIG. 2, as noted above, the frequency control DAC 116 drives the oscillator 120 during each of the guard time slots using the appropriate frequency control data 113a, 113b which has been compensated for any modulation occurring during the data transmission time slots. During data transmission time slot N, the switch 124 is opened and the modulation DAC 114 modulates the oscillator 120. During this time slot N, the feedback counter 102 is counting the cycles of the output signal. The resulting frequency count data 103, which includes "errors" due to the presence of modulation in the output signal, and modulation data 111b are processed by the processor 108 during data transmission time slot N+1. The data processor 108 corrects these "errors" using the modulation data 111b from the modulator 110, thereby causing compensated, or corrected, frequency control data 113a, 113b to be presented to the frequency control DAC 116 and VCO 120. Accordingly, the correct analog frequency control signal 117 becomes available for driving the oscillator circuit 120 during the next appropriate guard time slot.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a frequency synthesizer with a digital frequency lock loop (FLL), comprising:

a frequency measurement circuit that couples to and receives from a controllable signal generator circuit a controlled signal having a controlled signal frequency, measures said controlled signal frequency and provides measured frequency data, wherein said controlled signal frequency has associated therewith a center frequency value, an instantaneous frequency value and a frequency deviation value equal to a difference between said center and instantaneous frequency values, and said measured frequency data represent said instantaneous frequency value;

a modulation control circuit that couples to said controllable signal generator circuit, provides modulation data and provides to said controllable signal generator circuit a modulation control signal that controls said instantaneous signal frequency value, wherein said modulation data represent said frequency deviation value; and a data processing and control circuit, coupled between said frequency measurement circuit and said modulation control circuit, that couples to said controllable signal generator circuit, receives and processes said measured frequency data and said modulation data and provides to said controllable signal generator circuit at least one frequency control signal that controls said center signal frequency value.

2. The apparatus of claim 1, wherein said data processing and control circuit, following an initial application of power, further provides said at least one frequency control signal with a plurality of frequency control signal values, receives and processes a corresponding plurality of said measured frequency data, and generates and stores a plurality of frequency control data corresponding to another plurality of frequency control signal values representing a corresponding plurality of predetermined center signal frequency values.

3. The apparatus of claim 1, wherein said frequency measurement circuit comprises:

a counter control circuit that receives a reference timing signal and provides at least one timing control signal representing a predetermined time interval; and a feedback counter circuit, coupled to said counter control circuit, that receives said at least one timing control signal, counts said controlled signal and provides said measured frequency data.

4. The apparatus of claim 3, wherein said counter control circuit comprises:
a reference oscillator circuit that provides a reference signal having a reference frequency; and
a reference counter circuit, coupled to said reference oscillator circuit, that receives and counts said reference signal and provides said at least one timing control signal.

5. The apparatus of claim 3, wherein:
said at least one timing control signal comprises start and stop control signals; and
said feedback counter circuit starts said counting of said controlled signal following reception of said start control signal and stops said counting of said controlled signal following reception of said stop control signal.

6. The apparatus of claim 1, wherein said modulation control circuit includes a digital-to-analog conversion circuit that converts said modulation data and provides said modulation control signal.

7. The apparatus of claim 1, wherein said data processing and control circuit comprises:
a microprocessor circuit that receives and processes said measured frequency data and said modulation data and provides frequency control data;
a data storage circuit, coupled to said microprocessor circuit, that receives, stores and retrieves said frequency control data; and
a digital-to-analog conversion circuit, coupled to said data storage circuit, that receives and converts at least a portion of said frequency control data and provides one of said at least one frequency control signal.

8. The apparatus of claim 1, further comprising said controllable signal generator circuit, coupled to said frequency measurement circuit, said modulation control circuit and said data processing and control circuit, that receives said at least one frequency control signal and said modulation control signal and provides said controlled signal.

9. The apparatus of claim 8, wherein said controllable signal generator circuit comprises a voltage controlled oscillator circuit.

10. The apparatus of claim 8, wherein said controllable signal generator circuit comprises:
an oscillator circuit with first and second control inputs that receives said at least one frequency control signal and said modulation control signal and provides an oscillator signal; and
a frequency multiplication circuit, coupled to said oscillator circuit, that receives and multiplies said oscillator signal and provides said controlled signal.

11. An apparatus including a frequency synthesizer with a digital frequency lock loop (FLL), comprising:
a frequency measurement circuit that couples to and receives from a controllable signal generator circuit a controlled signal having a controlled signal frequency, measures said controlled signal frequency and provides measured frequency data, wherein
said controlled signal frequency has associated therewith a center frequency value, an instantaneous frequency value and a frequency deviation value equal to a difference between said center and instantaneous frequency values, and
said measured frequency data represent said instantaneous frequency value;
a modulation control circuit that couples to said controllable signal generator circuit, provides modulation data and provides to said controllable signal generator circuit corresponding modulation control data that control said instantaneous signal frequency value, wherein said modulation data represent said frequency deviation value; and
a data processing and control circuit, coupled between said frequency measurement circuit and said modulation control circuit, that couples to said controllable signal generator circuit and receives and processes said measured frequency data and said modulation data and provides to said controllable signal generator circuit frequency control data that control said center signal frequency value.

12. The apparatus of claim 11, wherein said data processing and control circuit, following an initial application of power, further provides said frequency control data with a plurality of frequency control data values, receives and processes a corresponding plurality of said measured frequency data and generates and stores a plurality of frequency test data corresponding to another plurality of frequency control data values representing a corresponding plurality of predetermined center signal frequency values.

13. The apparatus of claim 11, wherein said frequency measurement circuit comprises:
a counter control circuit that receives a reference timing signal and provides at least one timing control signal representing a predetermined time interval; and
a feedback counter circuit, coupled to said counter control circuit, that receives said at least one timing control signal, counts said controlled signal and provides said measured frequency data.

14. The apparatus of claim 13, wherein said counter control circuit comprises:
a reference oscillator circuit that provides a reference signal having a reference frequency; and
a reference counter circuit, coupled to said reference oscillator circuit, that receives and counts said reference signal and provides said at least one timing control signal.

15. The apparatus of claim 13, wherein:
said at least one timing control signal comprises start and stop control signals; and
said feedback counter circuit starts said counting of said controlled signal following reception of said start control signal and stops said counting of said controlled signal following reception of said stop control signal.

16. The apparatus of claim 11, wherein said data processing and control circuit comprises:
a microprocessor circuit that receives and processes said measured frequency data and said modulation data and provides said frequency control data; and
a data storage circuit, coupled to said microprocessor circuit, that receives, stores and retrieves said frequency control data.

17. The apparatus of claim 11, further comprising said controllable signal generator circuit, coupled to said frequency measurement circuit, said modulation control circuit and said data processing and control circuit, that receives said frequency control data and said modulation control data and provides said controlled signal.

18. The apparatus of claim 17, wherein said controllable signal generator circuit comprises:

a first digital-to-analog conversion circuit that receives and converts at least a portion of said frequency control data and provides a frequency control signal;

a second digital-to-analog conversion circuit that receives and converts said modulation data and provides a modulation control signal; and an oscillator circuit, coupled to said first and second digital-to-analog conversion circuits, that receives said frequency control signal and said modulation control signal and provides said controlled signal.

19. The apparatus of claim 18, wherein said oscillator circuit comprises a voltage controlled oscillator circuit.

20. The apparatus of claim 17, wherein said controllable signal generator circuit comprises:

a first digital-to-analog conversion circuit that receives and converts at least a portion of said frequency control data and provides a frequency control signal;

a second digital-to-analog conversion circuit that receives and converts said modulation data and provides a modulation control signal; and an oscillator circuit, coupled to said first and second digital-to-analog conversion circuits, that receives said frequency control signal and said modulation control signal and provides an oscillator signal; and a frequency multiplication circuit, coupled to said oscillator circuit, that receives and multiplies said oscillator signal and provides said controlled signal.

21. An apparatus including a frequency synthesizer with a digital frequency lock loop (FLL), comprising:

frequency measurement means for coupling to controllable signal generator means, receiving from said controllable signal generator means a controlled signal having a controlled signal frequency, measuring said controlled signal frequency and providing measured frequency data, wherein said controlled signal frequency has associated therewith a center frequency value, an instantaneous frequency value and a frequency deviation value equal to a difference between said center and instantaneous frequency values, and said measured frequency data represent said instantaneous frequency value;

modulation control means for coupling to said controllable signal generator means, providing modulation data and providing to said controllable signal generator means a modulation control signal that controls said instantaneous signal frequency value, wherein said modulation data represent said frequency deviation value; and data processing and control means, coupled between said frequency measurement means and said modulation control means, for coupling to said controllable signal generator means, receiving and processing said measured frequency data and said modulation data, and providing to said controllable signal generator means at least frequency control signal that controls said center signal frequency value.

22. The apparatus of claim 21, wherein said data processing and control means is further for providing, following an initial application of power, said at least one frequency control signal with a plurality of frequency control signal values and for receiving and processing a corresponding plurality of said measured frequency data and generating and storing a plurality of frequency control data corresponding to another plurality of frequency control signal values representing a corresponding plurality of predetermined center signal frequency values.

23. The apparatus of claim 21, further comprising said controllable signal generator means, coupled to said frequency measurement means, said modulation control means and said data processing and control means, for receiving said at least one frequency control signal and said modulation control signal and providing said controlled signal.

24. An apparatus including a frequency synthesizer with a digital frequency lock loop (FLL), comprising:

frequency measurement means for coupling to a controllable signal generator means, receiving from said controllable signal generator means a controlled signal having a controlled signal frequency, measuring said controlled signal frequency and providing measured frequency data, wherein said controlled signal frequency has associated therewith a center frequency value, an instantaneous frequency value and a frequency deviation value equal to a difference between said center and instantaneous frequency values, and said measured frequency data represent said instantaneous frequency value;

modulation control means for coupling to said controllable signal generator means, providing modulation data and providing to said controllable signal generator means corresponding modulation control data that control said instantaneous signal frequency value, wherein said modulation data represent said frequency deviation value; and data processing and control means, coupled between said frequency measurement means and said modulation control means, for coupling to said controllable signal generator means, receiving and processing said measured frequency data and said modulation data and providing to said controllable signal generator means frequency control data that control said center signal frequency value.

25. The apparatus of claim 24, wherein said data processing and control means is further for, following an initial application of power, providing said frequency control data with a plurality of frequency control data values, receiving and processing a corresponding plurality of said measured frequency data, and generating and storing a plurality of frequency test data corresponding to another plurality of frequency control data values representing a corresponding plurality of predetermined center signal frequency values.

26. The apparatus of claim 24, further comprising said controllable signal generator means, coupled to said frequency measurement means, said modulation control means and said data processing and control means, for receiving said frequency control data and said modulation control data and providing said controlled signal.

27. A method of frequency synthesis, comprising the steps of:

receiving a controlled signal with a controlled signal frequency having associated therewith a center frequency value, an instantaneous frequency value and a frequency deviation value equal to a difference between said center and instantaneous frequency values;

measuring said controlled signal frequency and generating measured frequency data representing said instantaneous frequency value;

generating modulation data representing said frequency deviation value;

generating a modulation control signal for controlling said instantaneous signal frequency value; and processing said measured frequency data and said modulation data and generating at least one frequency control signal for controlling said center signal frequency value.

28. The method of claim 27, further comprising, following an initial application of power, the steps of:
  generating said at least one frequency control signal with a plurality of frequency control signal values; and
  processing a corresponding plurality of said measured frequency data and generating and storing a plurality of frequency control data corresponding to another plurality of frequency control signal values representing a corresponding plurality of predetermined center signal frequency values.

29. The method of claim 27, wherein said step of measuring said controlled signal frequency and generating measured frequency data representing said instantaneous frequency value comprises counting said controlled signal for a predetermined time interval and generating said measured frequency data.

30. The method of claim 27, wherein said step of generating a modulation control signal for controlling said instantaneous signal frequency value comprises performing a digital-to-analog conversion of said modulation data and generating said modulation control signal.

31. The method of claim 27, wherein said step of processing said measured frequency data and said modulation data and generating at least one frequency control signal for controlling said center signal frequency value comprises:
  processing said measured frequency data and said modulation data and generating frequency control data;
  storing and retrieving said frequency control data; and
  performing a digital-to-analog conversion of said frequency control data and generating one of said at least one frequency control signal.

32. The method of claim 27, further comprising the step of receiving said at least one frequency control signal and said modulation control signal and generating said controlled signal.

33. A method of frequency synthesis, comprising the steps of:
  receiving a controlled signal with a controlled signal frequency having associated therewith a center frequency value, an instantaneous frequency value and a frequency deviation value equal to a difference between said center and instantaneous frequency values;
  measuring said controlled signal frequency and generating measured frequency data representing said instantaneous frequency value;
  generating modulation data representing said frequency deviation value;
  generating corresponding modulation control data for controlling said instantaneous signal frequency value; and
  processing said measured frequency data and said modulation data and generating frequency control data for controlling said center signal frequency value.

34. The method of claim 33, further comprising, following an initial application of power, the steps of:
  generating said frequency control data with a plurality of frequency control data values; and
  processing a corresponding plurality of said measured frequency data and generating and storing a plurality of frequency test data corresponding to another plurality of frequency control data values representing a corresponding plurality of predetermined center signal frequency values.

35. The method of claim 33, wherein said step of measuring said controlled signal frequency and generating measured frequency data representing said instantaneous frequency value comprises counting said controlled signal for a predetermined time interval and generating said measured frequency data.

36. The method of claim 33, wherein said step of processing said measured frequency data and said modulation data and generating frequency control data for controlling said center signal frequency value comprises:
  processing said measured frequency data and said modulation data and generating said frequency control data; and
  storing and retrieving said frequency control data.

37. The method of claim 33, further comprising the step of receiving said frequency control data and said modulation control data and generating said controlled signal.

* * * * *

UNITED STATES PATENT AND TRADEMARK OFFICE
CERTIFICATE OF CORRECTION

PATENT NO.    : 6,268,780 B1
DATED         : July 31, 2001
INVENTOR(S)   : Christian Olgaard et al.

It is certified that error appears in the above-identified patent and that said Letters Patent is hereby corrected as shown below:

<u>Column 9,</u>
Line 19, omit "and" after "signal;"
Line 56, insert -- one -- after "at least".

Signed and Sealed this

Nineteenth Day of March, 2002

Attest:

JAMES E. ROGAN
*Director of the United States Patent and Trademark Office*

*Attesting Officer*